United States Patent
Javerliac et al.

(10) Patent No.: US 8,941,428 B2
(45) Date of Patent: Jan. 27, 2015

(54) LOW POWER LATCHING CIRCUITS

(71) Applicant: ARM Limited, Cambridge (GB)

(72) Inventors: Virgile Javerliac, Grenoble (FR);
Yannick Marc Nevers, Grenoble (FR);
Laurent Christian Sibuet, Grenoble
(FR); Selma Laabidi, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/248,555

(22) Filed: Apr. 9, 2014

(65) Prior Publication Data

US 2014/0218089 A1   Aug. 7, 2014

Related U.S. Application Data

(62) Division of application No. 13/668,474, filed on Nov. 5, 2012, now abandoned.

(51) Int. Cl.
*H03K 3/289* (2006.01)
*H03K 3/037* (2006.01)
*G11C 11/412* (2006.01)
*G11C 19/28* (2006.01)
*H03K 3/012* (2006.01)

(52) U.S. Cl.
CPC .............. *H03K 3/037* (2013.01); *H03K 3/0372* (2013.01); *G11C 11/412* (2013.01); *G11C 19/28* (2013.01); *H03K 3/012* (2013.01)
USPC ............ 327/202; 327/203; 327/212; 327/218

(58) Field of Classification Search
CPC ..... H03K 3/012; H03K 3/037; H03K 3/0372; H03K 3/356; H03K 3/3562
USPC ......... 327/199, 202, 203, 208, 210–212, 214, 327/218; 326/93, 95, 98
See application file for complete search history.

(56) References Cited

U.S. PATENT DOCUMENTS

| 6,125,069 | A | 9/2000 | Aoki |
| 8,519,743 | B2 | 8/2013 | Teh et al. |
| 2009/0185654 | A1 | 7/2009 | Kang |

OTHER PUBLICATIONS

C.K. Teh et al., "A 77% Energy-Saving 22-Transistor Single-Phase-Clocking D-Flip-Flop with Adaptive-Coupling Configuration in 40nm CMOS", ISSCC 2011, Session 19, Low-Power Digital Technologies, 19.4, 2011 IEEE International Solid-State Circuits Conference, pp. 338-340.
Partial International Search Report mailed Jan. 27, 2014 in PCT/GB2013/052749.
International Search Report and Written Opinion of the International Searching Authority mailed Mar. 6, 2014 in PCT/GB2013/052749.

*Primary Examiner* — Patrick O'Neill
(74) *Attorney, Agent, or Firm* — Nixon & Vanderhye P.C.

(57) ABSTRACT

A latching circuit has an input for receiving the data value, an output for outputting a value indicative of the data value, a clock signal input for receiving a clock signal; and a pass gate. A feedback loop has two switching circuits arranged in parallel between two inverting devices, a first of the two switching circuits is configured to be off and not conduct in response to a control signal having a predetermined control value and a second of the two switching circuits is configured to be on and conduct in response to the control signal having the predetermined control value. A control signal controlling the two switching circuits is linked such that the switching devices switch their conduction status and the access control device act together to update the data value within the feedback loop.

15 Claims, 5 Drawing Sheets

LOW POWER LATCHING CIRCUITS

This application is a divisional of U.S. patent application Ser. No. 13/668,474, filed Nov. 5, 2012, pending, the entire contents of which are hereby incorporated by reference in this application.

TECHNICAL FIELD

The technical field relates to the field of data processing and in particular, to latching circuits for storing data values.

BACKGROUND

In synchronous data processing systems clocked latching circuits are used to receive and hold data values for a portion of a clock cycle such that the data values can be passed through the system in a synchronous and deterministic way. Latching circuits are conventionally formed of feedback loops with clocked pass gates for connecting a data input to the feedback loop or isolating the data input from the feedback loop. In this way the feedback loop is updated in response to the clock signal.

A feedback loop should be able to reliably hold the data value and yet be able to be overwritten by a new data value. Conventional latches had transmission gates at their inputs and feedback loops that were clocked by the clock signal. This allowed the feedback loop to be broken as the clock signal changed phase facilitating overwriting of the data value in time with the clock signal. A drawback of this approach is that where the data value does not change, some switching of devices occurs within the feedback loop in response to the clock signal changing, this is expensive on power. Furthermore, the transmission gates and the clocking of the feedback loop require both a clock signal and an inverted clock signal for their control, the generation of an inverted clock signal requires buffers on the clock tree which again is expensive on power.

In this regard within many processing systems flip flops formed of two latching elements typically consume much of the power and account for much of the logic area. Thus, a reduction in their power consumption is desirable, however, any increase in area of a flip flop will have a significant effect on the area of the circuit.

One solution that has been considered is to replace the transmission gates with simple transistor pass gates and use a differential device with data and complementary data inputs such that an inverted clock signal is not required. A problem with such a solution is that overwriting of the feedback loop with a new data value is difficult and the yield of such a system may not be high. Toshiba considered this problem in their paper "A 77% Energy-Saving 22-Transistor Single-Phase-Clocking D-Flip-Flop with Adaptive-Coupling Configuration in 40 nm CMOS" by Chen Kong The et al. published on pages 338-340 of the Digest of Technical Papers of the 2011 IEEE International Solid-State Circuits Conference, and found that for a master slave flip flop, the master latch with PMOS pass gates was not reliably overwritten with new data when designed without the clocked feedback loop. It provided a solution for this with a master latch having PMOS and NMOS transistors arranged in parallel on either side of the feedback loop. These PMOS and NMOS transistors were controlled by the data signal, such that when it changed value the feedback loop was disturbed and the state-retention coupling weakened during the transition. In particular, the paper notes that the provision of the NMOS transistor turning on the side of the loop to be discharged helps the discharge of this side.

A drawback of this solution is the additional transistors required for the master latch, although this was compensated for in some regard by the reduced number of transistors required for the pass gates which had replaced transmission gates with simple transistors.

It would be desirable to have a latching circuit with low power consumption particularly during low data activity that has an acceptable yield.

SUMMARY

A first aspect provides a latching circuit for receiving and holding a data value said latching circuit comprising:

a feedback loop comprising two inverting devices arranged in a feedback loop, an output of a first inverting device being connected to an input of a second inverting device at a first portion of said feedback loop, said first portion holding said data value and an output of said second inverting device being connected to an input of said first inverting device at a second portion of said feedback loop, said second portion holding a complementary data value;

a first input for receiving a data value;

an output for outputting a value indicative of said data value from said feedback loop;

a clock signal input for receiving a clock signal;

an access control device configured to connect or isolate said first input from said first portion of said feedback loop in dependence upon a value of said clock signal; wherein said feedback loop comprises two switching circuits arranged in parallel at one of said first or said second portion of said feedback loop, said switching circuits being configured such that one of said switching circuits provides a connection between said inverting devices at said one of said first or second portion of said feedback loop, while an other of said second or first portion comprises a conducting element providing a permanent connection between said inverting devices;

said latching circuit comprises control signal circuitry configured to provide at least one control signal to control said two switching circuits, said two switching circuits and said control signal circuitry being configured such that in response to said at least one control signal one of said two switching circuits is on and provides said connection between said inverting devices and said other of said two switching circuits is off; wherein said control signal circuitry is configured to provide said at least one control signal in dependence upon said data value such that in response to said data value changing said at least one control signal changes and one of said two switching devices that is currently on changes to said other of said two switching devices and said switching device that turns on and said access control device act together to update said data value within said feedback loop.

The technology described herein recognises that although the clocking of the classic feedback loop facilitates the overwriting of a stored data value, where data values are not changing this clocking consumes power for no advantage. It also recognises that the provision of switches in the feedback loop that switch in response to the data value changing allows the feedback loop to be disturbed only when a data value changes and helps the overwriting of the feedback loop at this point, without consuming unnecessary power on each clock cycle.

Although the idea of providing switching circuits that are controlled by the data signal within a feedback loop has been suggested by Toshiba this is in the specific case of a master latch with a PMOS pass gate and requires four additional devices, two on each side of the feedback loop, such that irrespective of the value written and the value stored a discharge path through an NMOS transistor is provided.

The present technique has recognised that latching elements with NMOS pass gates may also have a low yield in modern designs. Furthermore, the present technique has found that the use of a symmetrical design for the latch with the two transistors in parallel on either side of the inverting devices in the feedback loop is expensive in area and not necessary. An asymmetrical design with only one pair of switching devices on one portion of the feedback loop with a permanent connection that does not require active devices that switch on the other was found to provide enough additional disturbance to allow the feedback loop to be overwritten.

Although the output may be connected to the second portion of the feedback loop and output the complementary data value, in some embodiments the output is connected to the first portion of the feedback loop and is configured to output said data value. Generally, latching elements latch a data value through them and as such will output the received data value, however in some cases it may be advantageous if an inverted version of the data value is output, in which case the output is connected to the second portion of the feedback loop.

In some embodiments said latching circuit comprises at least one inverter for inverting said received data value, said latching circuit being configured to transmit said data value to said two switching circuits as said control signal prior to said data value being inverted by at least one of said at least one inverter, such that said data value is received at said two switching devices prior to said data value being received at said first input.

The latching circuit may require at least one inverter to invert the data signal, in particular, where the control signal uses the inverted value of the data value as a control signal. In such a case, it is advantageous if the inverters are used on the path to the data input rather than on the path to the control signal. In this way, the two switching devices will have received their control signal before the data value is received at the input. This can be advantageous as it is often more efficient if switching devices start to switch on before there is a load on these devices and thus, if they receive the signal before the value is received at the input then the timing of the circuit and the power consumed may be improved. It should be noted that the time that the signal is received by the feedback loop will also depend on the clock that controls the access control device. However, reducing the time required for it to reach the switching devices will improve performance In some embodiments, said first of said two switching devices is configured to discharge charge from said feedback loop when on and said second of said two switching devices is configured to drive a charge into said feedback loop when on.

It may be advantageous if the two switching devices are different devices, one being configured to discharge charge from the feedback loop when on and the other configured to drive charge into the feedback loop when on. Provided that the control signal is selected appropriately, this behaviour will help change the data value stored.

In some embodiments said first and second switching devices are complementary devices such that one is on and the other off in response to a same control signal, wherein said control signal circuitry is configured to provide a control signal that has a same value as said complementary data value to be input to said feedback loop where said two switching circuits are arranged on said first portion, and a control signal that has a same value as said data value to be input to said first input where said two switching circuits are arranged on said second portion.

Although the first and second devices do not need to be different devices, provided the control signals are arranged such that one is on while the other is off, in some embodiments they are. In such a case they can receive the same control signal and the control signal circuitry may simply be a conducting element for conducting the data signal or the complementary data signal to the switching devices or a conducting element and an inverter if the signal to be transmitted needs inverting.

In some embodiments, said first switching device comprises an NMOS transistor and said second switching device comprises a PMOS transistor.

NMOS and PMOS devices make particularly effective switching devices in this case with the NMOS device providing a good discharge route while the PMOS device provides charge into the system. It should be noted that in other embodiments one might use the same device for both switching devices with an inverter on one of the device's input such that the required behaviour, of one of the devices always being on whatever the value of the control signal, is adhered to.

In some embodiments, said access control device comprises one of a PMOS or an NMOS transistor and a transmission gate.

The access control devices may be formed of PMOS or NMOS transistors. This has the advantage of allowing one to select an appropriate device to turn on depending on the clock signal without the need to invert the clock signal. As noted previously an inverter on the clock tree path increases power consumption.

In other embodiments, said access control device comprises a transmission gate.

Although, it may be advantageous to use PMOS and NMOS transistors respectively such that no inversion of the clock signal is required, in other embodiment a transmission gate can be used and in this case an inverted clock signal will be required. An inverter on the clock signal will help control the capacitance seen on this clock signal and may therefore be advantageous in some cases. Although, the power consumption will be increased by the use of this inverter, it will still be significantly below that of a classical latching circuit which has a tristatable inverter on its feedback loop and therefore has devices that switch in response to the clock signal changing phase.

In some embodiments said latching circuit further comprises a second input for receiving a complementary data value and a second data output for outputting a complementary version of a value output by said data output, and a further access control device configured to connect or isolate said complementary data input from said feedback loop in dependence upon a value of said clock signal.

Although in some embodiments, the latching circuit may have a single input and output, in other embodiments it may be a differential latching circuit with an input and a complementary data input. It should be noted that where there is no clock tree inverter then differential latching circuits are generally required. However, the inverted data signal may not be received externally but may be generated within the latching circuit itself and in such a case the latching circuit will only have a single input.

A second aspect of the present invention provides a flip flop comprising a first latching element according to a first aspect of the present invention where said output is connected to said first portion of said feedback loop and is configured to output said data and a second latching circuit according to a first aspect of the present invention, wherein said access control device of said second latching circuit is connected to said output of said first latching circuit, and said access control device of said first latching circuit and said access control device of said second latching circuit are configured to operate on different phases of said clock cycle such that one is open when the other is closed.

The latching circuits of the first aspect of the present invention may be connected together to form a flip flop.

In some embodiments, said switching circuits of said first and second latching circuits are on a same portion of said latching circuits and said control signal for controlling said switching devices of said second latching circuit comprises said control signal for controlling said switching devices of said first latching circuit, said flip flop further comprising a connector for connecting said control signal from said first latching circuit to said second latching circuit.

Where the latching circuits are combined to form a flip flop it was found to be advantageous for the control signal controlling the two switching circuits of the first latching circuit to be transmitted to control the second latching circuit. In this way, the second latching circuit can be prepared in advance in that it has time to start discharging the internal nodes before the stored value changes. This smooths the transition resulting in less current being consumed.

In some embodiments, said flip flop comprises at least one inverter for inverting said received data value, said flip flop being configured to transmit said data value to said control signal circuitry prior to said data value being inverted by at least one of said at least one inverter, such that said data value is received at said two switching devices prior to said data value being received at said first input.

As noted previously, where there are inverters inverting the data signal then it is preferable that these are on the data input paths rather than the control signal paths such that the switching devices in the feedback loops are controlled early in the cycle allowing the smoothing of the current in the transition resulting in lower current and therefore power consumption and a faster transition.

In some embodiments, said access control devices comprise either PMOS or NMOS transistors, said access control devices of said first and said second latching circuit comprising different types of transistor.

Where the access control devices are either PMOS or NMOS transistors and are different for the first and second latching circuit then no inverted clock signal is required and yet the two latching circuits can still operate on different phases of the clock cycle.

Alternatively, said access control devices both comprise either a transmission gate or an NMOS transistor. Having a PMOS transistor as an access control device generates its own problems in that it is a weak device and it is difficult for a signal transmitted through this device to change the value stored in the feedback loop. In some cases, it may be advantageous not to use a PMOS device as an access control device but to use either a transmission gate, or if area is an issue an NMOS device. In this case, an inverter will be required on the clock signal to enable the latching circuit to operate on different phases of the clock cycle and provide a flip flop. This will have power implications but the flip flop will still consume significantly less power than a conventional flip flop that has the tristatable latching devices that have devices that switch with the clock signal.

A third aspect of the present invention provides a flip flop comprising:

first and second latching circuits arranged in series, each of said latching circuits comprising:

a feedback loop comprising two inverting devices, an output of a first inverting device being connected to an input of a second inverting device at a first portion of said feedback loop, said first portion storing said data value and an output of said second inverting device being connected to an input of said first inverting device at a second portion of said feedback loop, said second portion storing a complementary data value;

a first input for receiving said data value;

an output for outputting said data value from said feedback loop;

a clock signal input for receiving a clock signal;

an access control device configured to connect or isolate said first input from said first portion of said feedback loop in dependence upon a value of said clock signal; wherein said feedback loop comprises two sets of two switching circuits arranged in parallel at both said first and said second portion of said feedback loop, said switching circuits being configured such that one of said switching circuits provides a connection between said inverting devices at said first and second portion; and said latching circuit comprises control signal circuitry configured to provide at least one control signal to control said two sets of switching circuits, said two sets of switching circuits and said control signal circuitry being configured such that in response to said at least one control signal transmitted from said control signal circuitry one of said two switching circuits is on and provides said connection between said inverting devices and said other of said two switching circuits is off in each of said two sets; and said control signal circuitry is configured to provide said at least one control signal in dependence upon said data value such that in response to said data value changing said at least one control signal changes and said one of said two switching devices that is currently on changes to said other of said two switching devices in each set and said switching devices that turn on and said access control device act together to update said data value within said feedback loop; and said flip flop comprises a connection for transmitting said control signals controlling said two sets of switching circuits in said first latching circuit to said second latching circuit, such that said respective sets of switching circuits are controlled by same control signals;

wherein said access control device of said second latching circuit is connected to said output of said first latching circuit, and said access control device of said first latching circuit and said access control device of said second latching circuit are configured to operate on different phases of said clock cycle such that one is open when the other is closed.

In a third aspect of the invention a symmetric flip flop that has two switching devices on either side of the feedback loop in both the master and slave latching circuits is disclosed. By providing the switching devices in both the first and second latching circuits of a flip flop, a flip flop with a high yield is generated. Additionally, the flip flop will have an improved performance when compared to a flip flop where only the master latch has the switching circuits in the feedback loop, as the switching circuits help improve the timing of the latches. Previously, it was considered that only the latching circuit in the flip flop with the PMOS pass gate would require the switching circuits to help it update, however, it has been found that both latches in many cases require assistance and that providing the switching circuits in both latching circuits increases yield and has the additional effects of increasing performance.

Furthermore, as the control signal for controlling the switching devices is sent directly from the master to the slave latch, the slave will receive its control signal before the data input is received at the slave element which allows the latching circuit to be prepared by discharging of the nodes and thereby smoothes the transition reducing current consumption and increasing performance.

In some embodiments, each of said first and second latching circuits comprise:

a second input for receiving a complementary data value and two outputs, said output and a complementary output for outputting said data value and said complementary data value respectively, wherein said second input comprises an access control device configured to connect or isolate said complementary data input from said feedback loop in dependence upon a value of said clock signal; wherein said output and complementary output of said first latching circuit are connected to said access control devices of said first and second input respectively.

Although the latching circuits, making up the flip flops may have single inputs and single outputs, in many cases they may be differential latching circuits with data and complementary data inputs and data and complementary data outputs.

In some embodiments, said flip flop comprises at least one inverter for inverting said received data value, said flip flop being configured to transmit said data value to one of said two sets of two switching circuits as said control signal prior to said data value being inverted by at least one of said at least one inverter, such that said data value is received at said set of two switching devices prior to said data value being received at least one of said inputs.

As noted previously, where the data value needs to be inverted then it is advantageous if this is done on the path to the data input and not on the control signal path. This enables the control signal at the first latch to be received early and ahead of the data signal and allows the latch to be prepared.

A fourth aspect of the present invention provides a method of updating a value stored in a master slave flip flop, said master slave flip flop comprising a master latch and a slave latch each having feedback loops for holding said data value, each feedback comprising a set of two switching devices arranged in parallel on said feedback loop and configured such that either one of said two switching devices is on at any one time and completes said feedback loop, and access control devices for controlling access to said feedback loops, said access control devices being configured to provide said access on different phases of a clock cycle, said method comprising the steps of:

receiving a data value that is different to a data value currently stored;

providing at least one control signal from said data value and transmitting said at least one control signal to said set of two switching devices arranged on a feedback loop of said master and said slave latches;

switching one of said switching devices in each set on and an other off in response to said at least one control signal;

in response to said clock signal transmitting said data value via an access control device to said feedback loop of said master latch;

updating said data value stored in said master latch;

in response to said clock signal changing phase transmitting said updated data value from said master latch to said slave latch; and updating said data value held in said slave latch.

A fifth aspect of the present invention provides a latching circuit for receiving and holding a data value said latching circuit comprising:

a feedback loop comprising two inverting means for inverting a signal arranged in a feedback loop, an output of a first inverting means being connected to an input of a second inverting means at a first portion of said feedback loop, said first portion holding said data value and an output of said second inverting means being connected to an input of said first inverting means at a second portion of said feedback loop, said second portion holding a complementary data value;

a first input means for receiving a data value;

an output means for outputting a value indicative of said data value from said feedback loop;

a clock signal input means for receiving a clock signal;

an access control means for connecting or isolating said first input means from said first portion of said feedback loop in dependence upon a value of said clock signal; wherein said feedback loop comprises two switching means arranged in parallel at one of said first or said second portion of said feedback loop, said switching circuits being providing a connection between said inverting means at said one of said first or second portion of said feedback loop, while an other of said second or first portion comprises a conducting means for providing a permanent connection between said inverting means;

said latching circuit comprises control signal means for providing at least one control signal for controlling said two switching means, said two switching means and said control signal means being configured such that in response to said at least one control signal transmitted from said control signal means one of said two switching means is on and provides said connection between said inverting means and said other of said two switching means is off; wherein said control signal means is for providing said at least one control signal in dependence upon said data value such that in response to said data value changing said at least one control signal changes and one of said two switching means that is currently on changes to said other of said two switching means and said switching means that turns on and said access control means act together to update said data value within said feedback loop.

The above, and other objects, features and advantages of this invention will be apparent from the following detailed description of illustrative embodiments which is to be read in connection with the accompanying drawings.

DESCRIPTION OF THE EXAMPLE NON-LIMITING EMBODIMENTS

Figure 1:
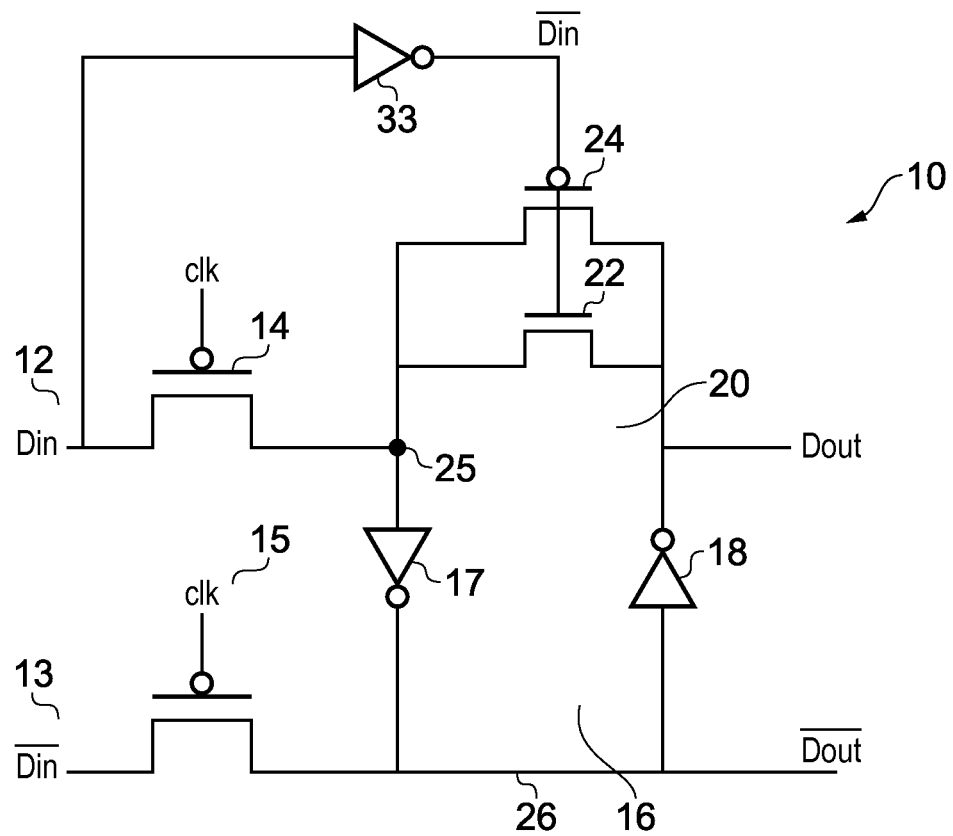
FIG. 1 shows an asymmetric latching signal according to an embodiment of the first invention.

FIG. 1 shows an asymmetric latching circuit 10 according to the present technique. The latching circuit has an input 12 through which data is input via an access control device 14 which is clocked by a clock signal CLK. There is a further complimentary data input 13 through which the complementary data value is input via access control gate 15 which is also clocked by clock signal CLK. The latching circuit has two inverters 17 and 18 arranged in a feedback loop 16. A first portion 20 of the feedback loop 16 has two switching devices 22 and 24 arranged in parallel. A second portion 26 of the feedback loop 16 comprises a simple connection between the output of the inverting device 17 and the input of inverting device 18. The first portion 20 of the feedback loop will hold the data value input at input 12 while the second portion 26 of the feedback loop will hold the complementary data value that is input at input 13.

Switching devices 22 and 24 are controlled by a control signal that is linked to the received data input signal. In this case, the control signal is linked to the data input by inverter device 33, which therefore provides a control signal having a value equal to the complementary data value that controls these switching devices. As in this case switching device 22 is an NMOS device while device 24 is a PMOS device then one of them is on and the other off at any one time. Thus, if the complementary data value is low, that is a digital 0, the PMOS transistor 24 is on while the NMOS transistor 22 is off, while if it is a 1 the inverse is true.

Looking at the operation of the latching circuit 10 and in particular, the writing of a 0 to the latching circuit that is currently storing a 1, then the following occurs. The value in the first portion 20 is initially at 1 as a 1 is stored, and there are therefore 1's on either side of the transistors 22 and 24. Initially the control signal will be a 0 being the inverse of the data value and the PMOS transistor will be on and the NMOS transistor off. When the input data value $D_{in}$ changes from a 1 to 0 the control signal will change from a 0 to 1 and the PMOS transistor will turn off and the NMOS transistor on.

This control signal is received at these switching devices before it is received at the input to the feedback loop which is controlled by access device 14. When the clock signal goes low, access gate 14 turns on and the input data 0 appears at this input node shown here as 25. The charge held at 25 will reduce by discharging via PMOS transistor 14 and via NMOS transistor 22. As access control device 14 is a PMOS transistor it is weak for discharge and the NMOS transistor 22 that is on will help the discharge and the feedback loop 16 will be able to switch values. In this way, without the need to clock the feedback loop the value stored can be changed. This is achieved by having switching devices where one or other always provide some connection for the feedback loop, but the one that provides this connection changes when the data value changes and this allows the feedback loop to be disturbed and an update to occur.

Figure 2:
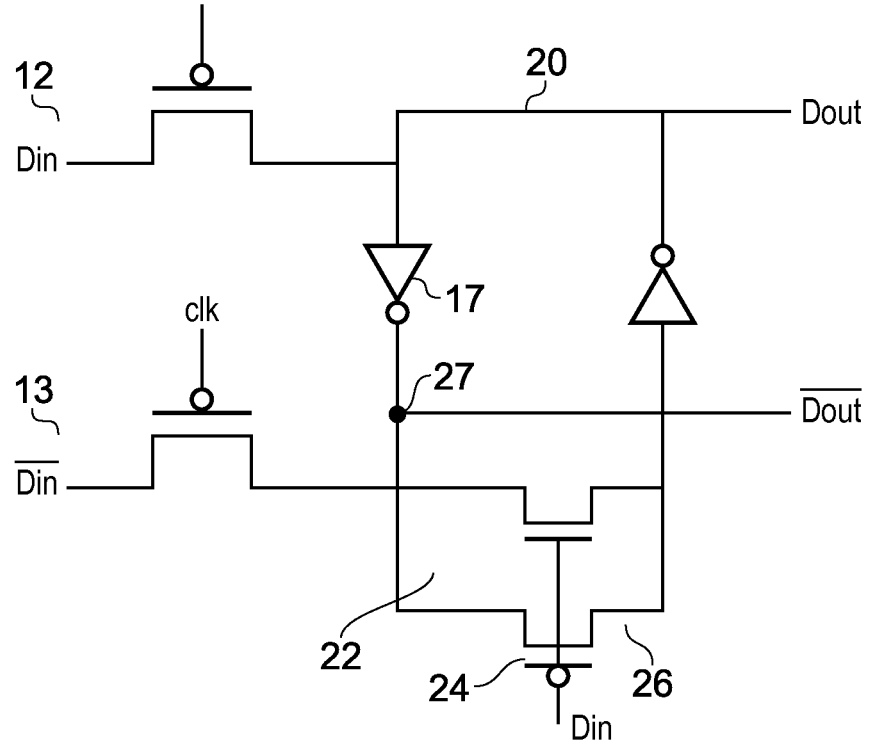
FIG. 2 shows an alternative embodiment of an asymmetric latching circuit according to an embodiment of the present invention.

FIG. 2 shows an alternative embodiment where the switching devices are on the second portion 26 of the feedback loop as opposed to the first portion 20. In this case, the control signal is equivalent to the data value that is input at the input 12. This arrangement works in a similar way the latching circuit of FIG. 1. It should be noted that the output node 27 for providing the complementary output value is arranged at the output to inverter 17 before the switching devices 22 and 24. This avoids the extra capacitance of these switching devices being seen on the output and increases the speed of the switching at the output. In the previous example the output node was directly above the inverting device 18 and was therefore driven by this inverting device and the switching devices 22 and 24 did not affect the value.

Figure 3:
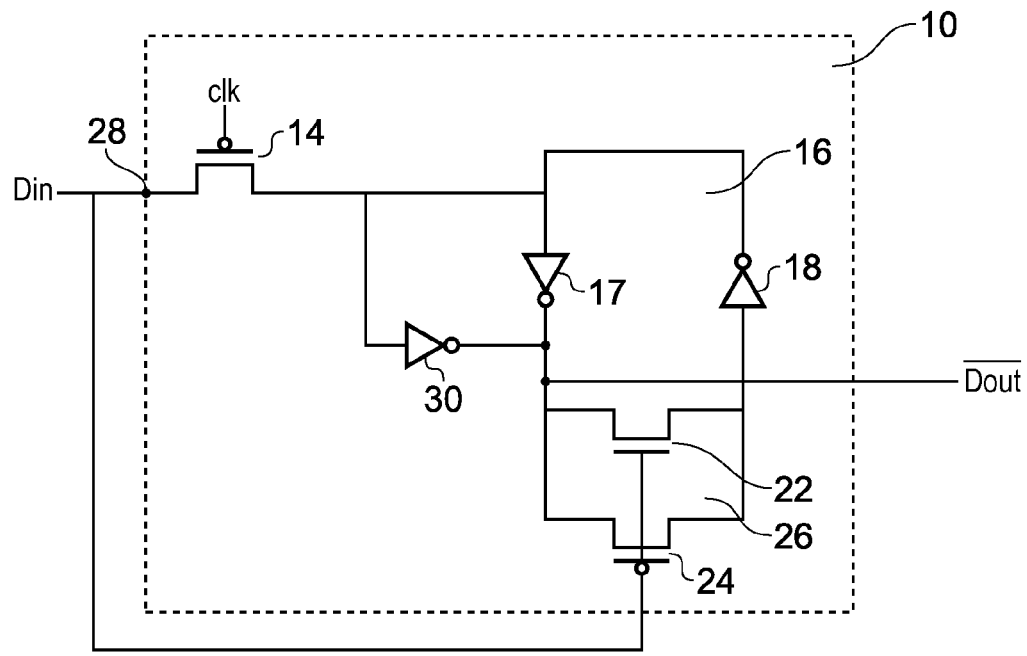
FIG. 3 shows an asymmetric latching circuit with a single input according to an embodiment of the present invention.

FIG. 3 shows an alternative embodiment of the present technique where latching circuit 10 has a single input at input node 28 and a single access control device 14. The latching circuit is still a differential latching circuit but there is an inverter 30 that provides a complementary data value within the latching circuit 10. In this embodiment the switching devices 22 and 24 are on the second portion 26 of the feedback loop 16 and the only output is a single output which is the complementary data output. Thus, in this case the latching circuit 10 will act as an inverting latching circuit.

Figure 4:
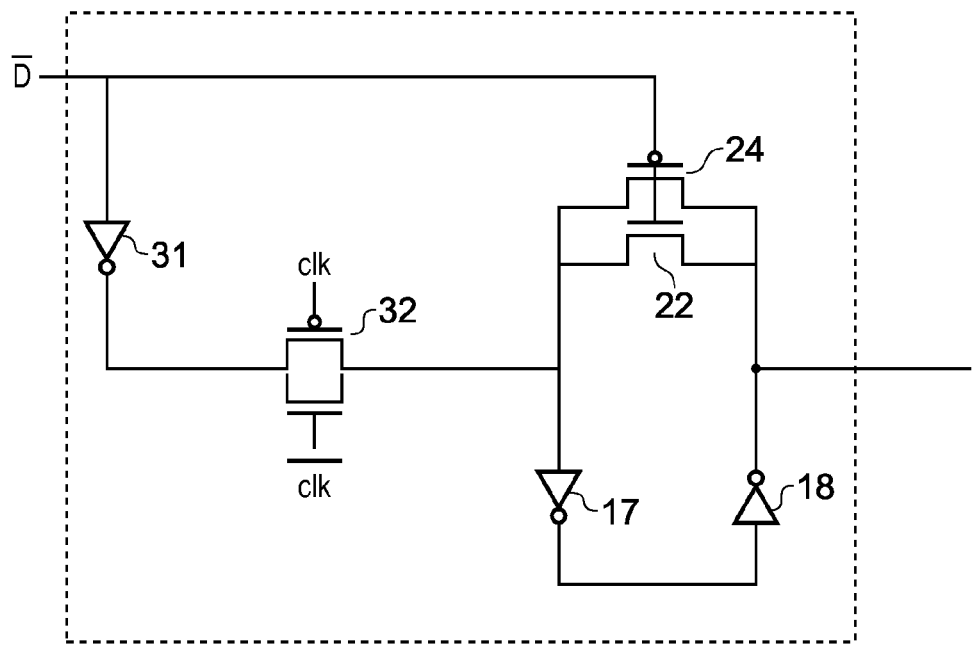
FIG. 4 shows an asymmetric latching circuit where the transmission gate is input according to an embodiment of the present invention.

FIG. 4 shows an alternative embodiment where the pass gate 14 is replaced by a transmission gate 32. In this case, there is only one data input which is shown here as a complementary data input. A transmission gate is a stronger device as a pass gate than a simple transistor and thus, will be more effective at changing the data value stored. However, it has the drawback of requiring an inverted clock signal to control it such that there is a requirement for an inverter on the clock tree which increases power consumption. However, in this embodiment the feedback loop 16 is itself not clocked and therefore, there is no power loss arising due to switching of devices within the feedback loop. Although the transmission gate is stronger than a simple transistor pass gate, switching devices 22 and 24 are still provided on the feedback loop to aid the updating of the data value. These not only increase the yield of the latch but also the timing by facilitating the switching of data value held in the feedback loop.

In this embodiment the received data signal is transmitted directly to the switching devices 22 and 24 and therefore the control signal for switching these is received early. An inverter 31 is located on the data path to provide the required value to feedback loop via transmission gate 32.

Figure 5:
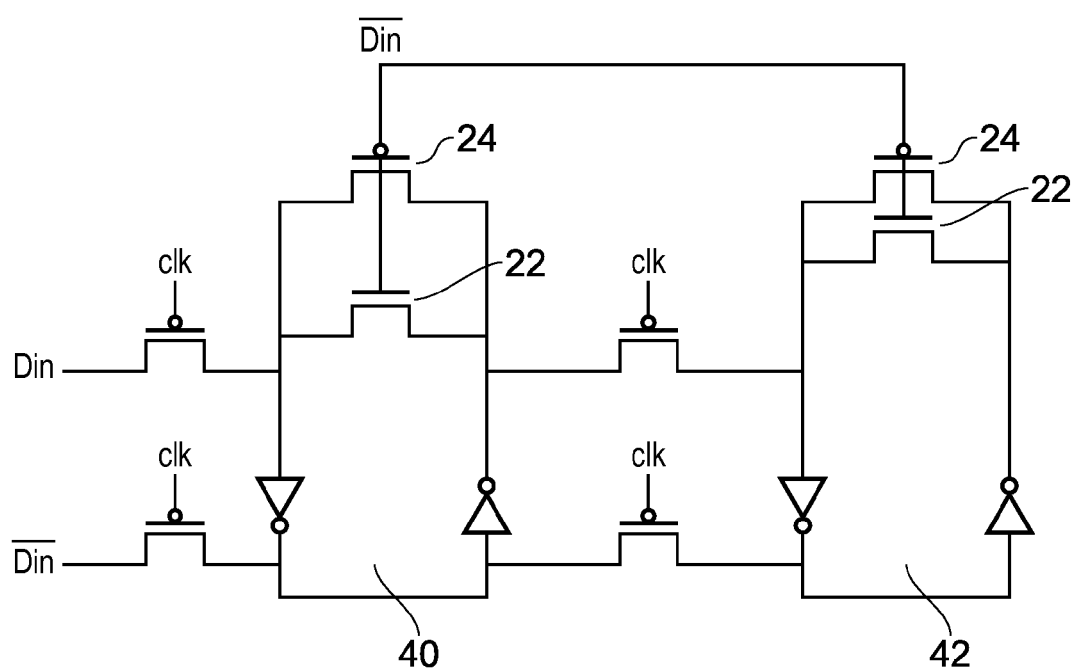
FIG. 5 shows two asymmetric latching circuits arranged as a flip flop according to an embodiment of the present invention.

FIG. 5 shows a flip flop comprising two asymmetric latching circuits. This flip flop has a first latching circuit which acts as the master latch 40 and a second latching circuit that acts as the slave latch 42. Both of these latches have first and second switching devices 22 and 24 on the first portion of the feedback loop. Both of these switching circuits are controlled by the same signal which is the complementary data value. By controlling the slave with the same signal as the master the switching devices on the slave are switched ahead of the data value arriving at the slave. This allows the slave to be prepared and the internal nodes to start to discharge such that the timing of the switch is decreased as is the power consumption.

Figure 6:
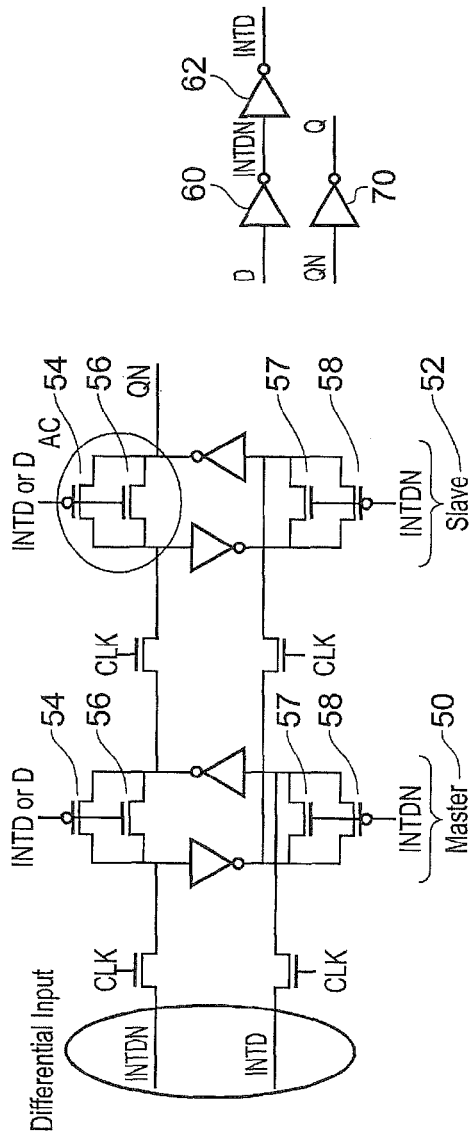
FIG. 6 shows to symmetric latching circuits arranged as a flip flop according to an embodiment of the present invention.

FIG. 6 shows a flip flop according to the present technique with two symmetric latching circuits 50 and 52. This circuit also comprises inverters 60 and 62 for inverting the input data value and an inverter 70 for inverting the output data value. As can be seen the switching circuits 54, 56, 57, 58 on opposite sides of the same feedback loop are controlled by opposite signals. The switching circuits of the master and slave latch are controlled by the same signal for switching circuits on the same respective sides.

The switching circuits 54, 56 shown on the top of the latching circuits in this diagram are controlled by a value equal to the data value D. It is noted that this can be the original data value D or the data value inverted twice INTD by the two inverters. It is preferable if the original data value is used as this allows the switching circuits to be switched earlier in the cycle which improves performance and reduces power consumption. In such a case the control signal circuitry that provides this signal is simply a conducting element between the data input and the switching circuits, which are in this case PMOS and NMOS transistors. The switching circuits 57, 58 on the lower half of the latching circuits 50 and 52 are switched by the complementary data value INTDN. Thus, in this case the control signal circuitry that provides this control signal comprises inverter 60.

In this embodiment, the input to the flip flop has been inverted twice and is the signal INTD. The input to the complementary data input has been inverted once.

The switching circuits 54, 56, 57, 58 on the feedback loop of the slave latch are controlled by the same signal as those on the master latch which means that they received their control signal and where it is different to the stored value, switch before this difference in value is seen across the terminals of these switching circuits, this improves the performance of the switching circuit that is switching on. Furthermore, for the node that is to be discharged the switching circuit will start discharging the charged node before the new value is seen at the input, which smooths the transition, reduces the current consumed and increases the speed of the transition.

Figure 7:
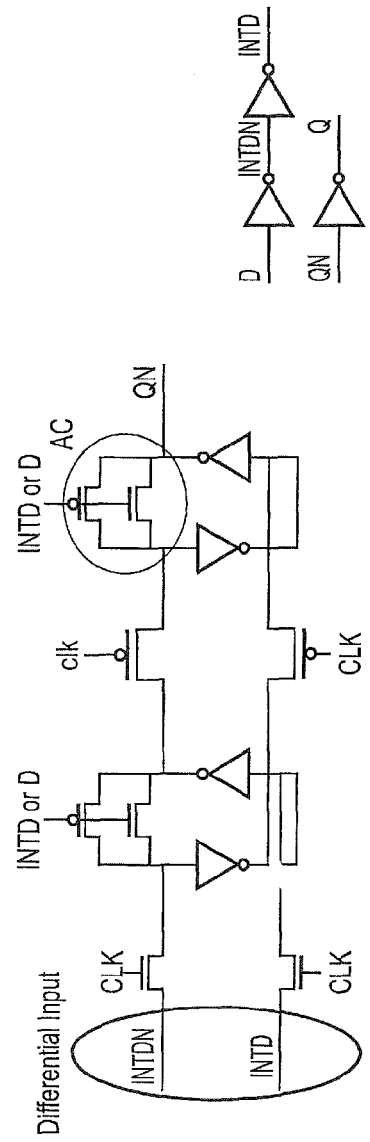
FIG. 7 shows an alternative embodiment of two asymmetric latching circuits arranged in an embodiment of the present invention.

FIG. 7 shows a flip flop according to an embodiment of the present invention with asymmetric latching circuits as in FIG. 5. In this case as in the case of FIG. 6 the control signals for the switching circuits are preferably the data value received while the data value input to the flip flop is this value inverted twice. Furthermore, the control signal controlling the switching circuits of the master is the same as that controlling the switching circuit of the slave.

It should be noted that as the master and slave circuits both have the switching devices in their feedback loops there is a substantially better yield than would be the case if only one of them had these switching devices, there is also an improvement in the timing performance.

Tests for the flip flops according to the present technique have shown an improvement of about 20% in the rise transition and 10% in the fall transition compared to timings for the classical flip flop, although there is an increased set up time of about three times. The symmetric flip flop such as is shown in FIG. 6 has a higher set up time and higher power consumption but lower transition times than the asymmetric versions such as those shown in FIGS. 5 and 7. The set up time can be decreased by tying the control signals to the switching circuits directly to the data signal, such that the latching elements are prepared ahead of the data appearing at the input.

Regarding the area, the symmetric flip flop uses 26 transistors instead of 24 for the classical flip flop, while the asymmetric flip flop uses 22 transistors. The power consumption of the asymmetric flip flop for example, than the classical flip flop for low activity, about 35 to 40% less where there is 50% activity, while it is still 6 to 12% less for 100% activity. The level of activity is a measure of how often the data value changes. Certain circuits may not be actively used for processing for long lengths of time and where the classical flip flop that has a clocked feedback loop is, used power consumption is quite high despite the low activity. In the flip flops of the current technique devices on the feedback loop only switch when the data values change and thus, where data values do not change often power consumption is reduced.

Figure 8:
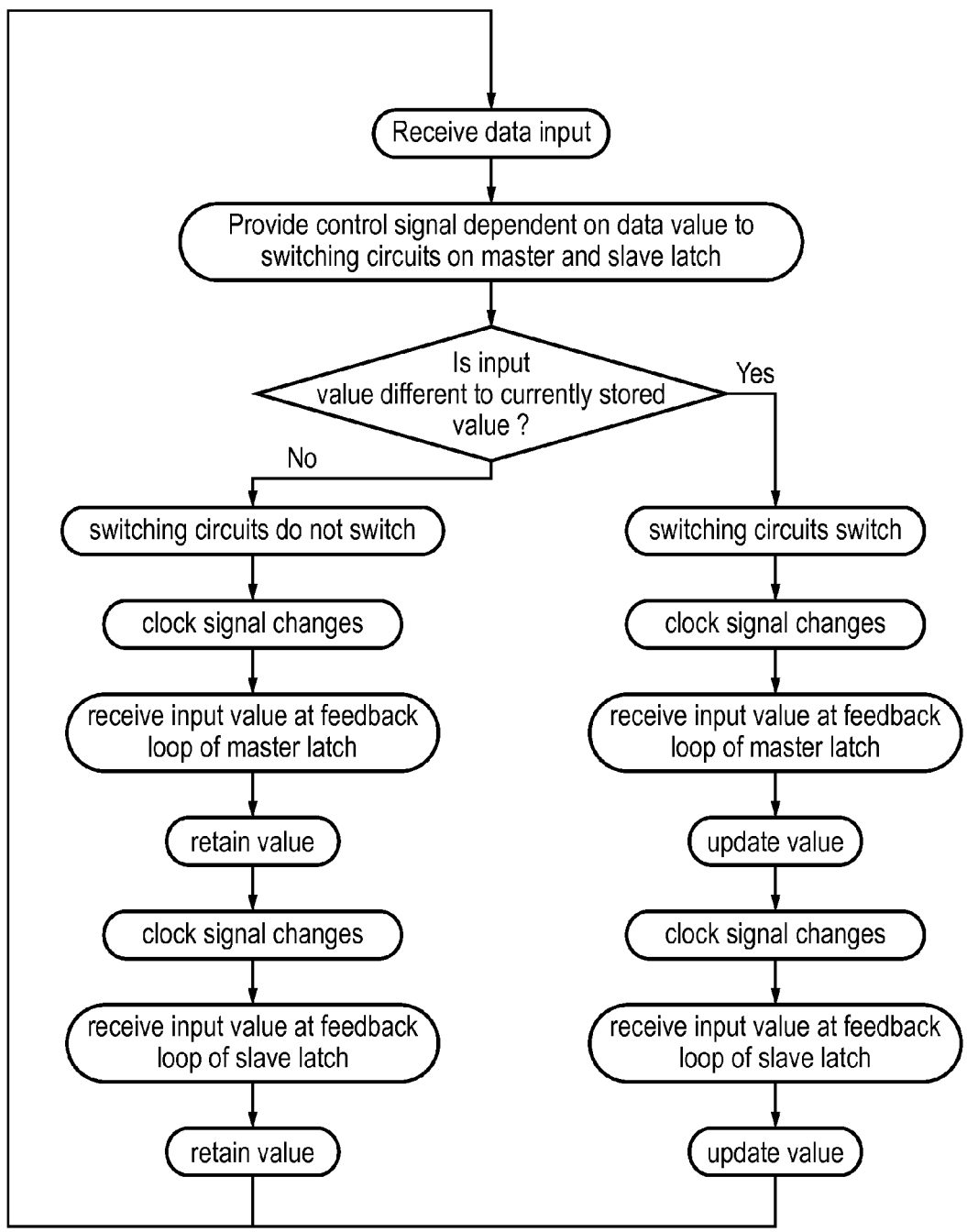
FIG. 8 shows a flow diagram illustrating steps in a method according to an embodiment of the present invention.

FIG. 8 shows a flow diagram illustrating steps in a method according to an embodiment of the invention. In an initial step an input value is received at a flip flop and a control signal dependent on this value is transmitted to two switching circuits arranged in parallel on a feedback loop in both the master and the slave latch. If the value used as a control signal should be different to the data value then it may be inverted on one of the paths either prior to the data input of the feedback loop of the master latch or prior to the switching devices. If the data value is inverted prior to input to the master latch the value may be inverted later in the latching chain to generate a correct output value.

If the received data input value is different to the value currently stored then the switching devices will switch as the control signal will change. In this case the device that was previously off and not conducting will switch on, while the switching device that was on will switch off. If the input value is not different then no switching will occur. As the control signal is sent to both the master and slave latch this will occur at both latches.

In response to the clock signal switching the data value is input to the feedback loop of the master latch and if it is a different value to that stored, the stored value will be updated, the switching of the switching devices helping the feedback loop to switch stored value. If the value is not a different value the feedback loop will simply retain its original value. In this case as none of the devices in the feedback loop are clocked and no change of state occurs, the power consumption will be very low.

As the signal has been input to a master slave flip flop rather than an individual latch circuit, then the slave latch has also received the control signal and if the data value input is different to that stored the switching circuits of the slave latch will also have switched, and when the clock phase changes the value from the master latch will be input to the slave latch and the value stored will be updated or retained depending on whether it has changed or not.

The process will then be repeated. In this regard where the data input does not change the first steps will be passive in that the control signal is already provided and the same signal will continue to be provided and no switching of the switching circuits will occur. The first active step will be the clock signal changing and therefore the access control device providing access to the master latch. However, as the data value has not changed although the access control device switches no other device will switch. This means that for times of low activity where data values remain constant the power consumption of the flip flop is very low.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. A flip flop comprising a first latching circuit and a second latching circuit, each of said first latching circuit and said second latching circuit for receiving and holding a data value, and each of said first latching circuit and said second latching circuit comprising:

a feedback loop comprising two inverting devices arranged in a feedback loop, an output of a first inverting device being connected to an input of a second inverting device at a first portion of said feedback loop, said first portion holding said data value and an output of said second inverting device being connected to an input of said first inverting device at a second portion of said feedback loop, said second portion holding a complementary data value;

a first input for receiving a data value;

an output for outputting a value indicative of said data value from said feedback loop;

a clock signal input for receiving a clock signal;

an access control device configured to connect or isolate said first input from said first portion of said feedback loop in dependence upon a value of said clock signal; wherein said feedback loop comprises two switching circuits arranged in parallel at one of said first or said second portion of said feedback loop, said switching circuits being configured such that one of said switching circuits provides a connection between said inverting devices at said one of said first or second portion of said feedback loop, while an other of said second or first portion comprises a conducting element providing a permanent connection between said inverting devices;

each of said latching circuits comprises control signal circuitry configured to provide at least one control signal to control said two switching circuits, said two switching circuits and said control signal circuitry being configured such that in response to said at least one control signal one of said two switching circuits is on and provides said connection between said inverting devices and said other of said two switching circuits is off; wherein said control signal circuitry is configured to provide said at least one control signal in dependence upon said data value such that in response to said data value changing said at least one control signal changes and one of said two switching devices that is currently on changes to said other of said two switching devices and said switching device that turns on and said access control device act together to update said data value within said feedback loop, wherein said output of said first latching circuit is connected to said first portion of said feedback loop and is configured to output said data value and said access control device of said second latching circuit is connected to said output of said first latching circuit, and said access control device of said first latching circuit and said access control device of said second latching circuit are configured to operate on different phases of said clock cycle such that one is open when the other is closed.

2. A flip flop according to claim 1, wherein in each of said first latching circuit and said second latching circuit said output is connected to said first portion of said feedback loop and is configured to output said data value.

3. A flip flop according to claim 2, wherein each of said first latching circuit and said second latching circuit further comprises a second input for receiving a complementary data value and a second data output for outputting a complementary version of a value output by said data output, and a further access control device configured to connect or isolate said complementary data input from said feedback loop in dependence upon a value of said clock signal.

4. A flip flop according to claim 1, wherein each of said first latching circuit and said second latching circuit comprises at least one inverter for inverting said received data value, said control signal circuitry being configured to receive said data value for generation of said control signal prior to said data value being inverted by at least one of said at least one inverter, such that said data value is received at said two switching devices prior to said data value being received at said first input.

5. A flip flop according to claim 1, wherein in each of said first latching circuit and said second latching circuit said first of said two switching devices is configured to discharge charge from said feedback loop when on and said second of said two switching devices is configured to drive a charge into said feedback loop when on.

6. A flip flop according to claim 1, wherein in each of said first latching circuit and said second latching circuit said first and second switching devices are complementary devices such that one is on and the other off in response to a same control signal, wherein said control signal circuitry is configured to provide a control signal that has a same value as said complementary data value to be input to said feedback loop where said two switching circuits are arranged on said first portion, and a control signal that has a same value as said data value to be input to said first input where said two switching circuits are arranged on said second portion.

7. A flip flop according to claim 6, wherein in each of said first latching circuit and said second latching circuit said first switching device comprises an NMOS transistor and said second switching device comprises a PMOS transistor.

8. A flip flop according to claim 1, wherein in each of said first latching circuit and said second latching circuit said access control device comprises one of a PMOS transistor, an NMOS transistor and a transmission gate.

9. A flip flop according to claim 1,
wherein said switching circuits of said first and second latching circuits are on a same portion of said latching circuits and said control signal for controlling said switching devices of said second latching circuit comprises said control signal for controlling said switching devices of said first latching circuit, said flip flop further comprising a connector for connecting said control signal from said first latching circuit to said second latching circuit.

10. A flip flop according to claim 9, wherein
said flip flop comprises at least one inverter for inverting said received data value, said flip flop being configured to transmit said data value to said control signal circuitry to said data value being inverted by at least one of said at least one inverter, such that said control signal is received at said two switching devices prior to said data value being received at said first input.

11. A flip flop according to claim 1,
wherein said access control devices comprise either PMOS or NMOS transistors, said access control devices of said first and said second latching circuit comprising different types of transistor.

12. A flip flop according to claim 1, wherein said access control devices comprise at least one of transmission gates and NMOS transistors.

13. A method of updating a value stored in a master slave flip flop, said master slave flip flop comprising a master latch and a slave latch each having feedback loops for holding said data value, each feedback comprising a set of two switching devices arranged in parallel on said feedback loop and configured such that either one of said two switching devices is on at any one time and completes said feedback loop, and access control devices for controlling access to said feedback loops, said access control devices being configured to provide said access on different phases of a clock cycle, said method comprising the steps of:

receiving a data value that is different to a data value currently stored;

providing at least one control signal from said data value and transmitting said at least one control signal to said set of two switching devices arranged on a feedback loop of said master and said slave latches;

switching one of said switching devices in each set on and an other off in response to said at least one control signal;

in response to said clock signal transmitting said data value via an access control device to said feedback loop of said master latch;

updating said data value stored in said master latch;

in response to said clock signal changing phase transmitting said updated data value from said master latch to said slave latch; and updating said data value held in said slave latch.

14. A method according to claim 13, further comprising a step of inverting said received data value at least once prior to transmitting said data value to said access control device of said master latch.

15. A flip flop comprising a first latching circuit and a second latching circuit, each of said first latching circuit and said second latching circuit for receiving and holding a data value, and each of said first latching circuit and said second latching circuit comprising:

a feedback loop comprising two inverting means for inverting a signal arranged in a feedback loop, an output of a first inverting means being connected to an input of a second inverting means at a first portion of said feedback loop, said first portion holding said data value and an output of said second inverting means being connected to an input of said first inverting means at a second portion of said feedback loop, said second portion holding a complementary data value;

a first input means for receiving a data value;

an output means for outputting a value indicative of said data value from said feedback loop;

a clock signal input means for receiving a clock signal;

an access control means for connecting or isolating said first input means from said first portion of said feedback loop in dependence upon a value of said clock signal; wherein said feedback loop comprises two switching means arranged in parallel at one of said first or said second portion of said feedback loop, said switching means providing a connection between said inverting means at said one of said first or second portion of said feedback loop, while an other of said second or first portion comprises a conducting means for providing a permanent connection between said inverting means;

each of said latching circuits comprises control signal means for providing at least one control signal for controlling said two switching means, said two switching means and said control signal means being configured such that in response to said at least one control signal transmitted from said control signal means one of said two switching means is on and provides said connection between said inverting means and said other of said two switching means is off; wherein said control signal means is for providing said at least one control signal in dependence upon said data value such that in response to said data value changing said at least one control signal changes and one of said two switching means that is currently on changes to said other of said two switching means and said switching means that turns on and said access control means act together to update said data value within said feedback loop, wherein said output of said first latching circuit is connected to said first portion of said feedback loop and is configured to output said data value and said access control means of said second latching circuit is connected to said output of said first latching circuit, and said access control means of said first latching circuit and said access control means of said second latching circuit are configured to operate on different phases of said clock cycle such that one is open when the other is closed.

* * * * *